(12) United States Patent
Kelley et al.

(10) Patent No.: US 11,812,587 B2
(45) Date of Patent: Nov. 7, 2023

(54) COMPUTER COOLING

(71) Applicant: Microsoft Technology Licensing, LLC, Redmond, WA (US)

(72) Inventors: Douglas Patrick Kelley, Sammamish, WA (US); Alexis Grace Schubert, Seattle, WA (US); Craig Steven Ranta, Olympia, WA (US); Kathryn Oseen-Senda, Seattle, WA (US); Dennis Trieu, Calgary (CA); Mark Edward Shaw, Carnation, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/361,064

(22) Filed: Jun. 28, 2021

(65) Prior Publication Data

US 2022/0354026 A1 Nov. 3, 2022

Related U.S. Application Data

(60) Provisional application No. 63/183,259, filed on May 3, 2021.

(51) Int. Cl.
*H05K 7/20* (2006.01)

(52) U.S. Cl.
CPC ..... *H05K 7/20809* (2013.01); *H05K 7/20818* (2013.01)

(58) Field of Classification Search
CPC .................. H05K 7/20809; H05K 7/20818
See application file for complete search history.

(56) References Cited

U.S. PATENT DOCUMENTS

| 9,693,485 | B2 * | 6/2017 | Inaba | H05K 7/20736 |
| 10,925,188 | B1 | 2/2021 | Keehn et al. | |
| 2009/0231800 | A1 * | 9/2009 | Franz | H05K 7/1488 |
| | | | | 361/679.37 |
| 2009/0260777 | A1 * | 10/2009 | Attlesey | H01L 23/473 |
| | | | | 165/104.33 |

(Continued)

OTHER PUBLICATIONS

"Invitation to Pay Additional Fees Issued in PCT Application No. PCT/US22/023572", dated Jul. 4, 2022, 14 Pages.

(Continued)

*Primary Examiner* — Abhishek M Rathod
(74) *Attorney, Agent, or Firm* — Rainier Patents, P.S.

(57) ABSTRACT

The description relates to cooling electronic components, such as computing devices. One example includes a rack defining a volume and multiple sealed chassis modules removably fluidly coupled to a two-phase condenser tank via a vapor coupler and a liquid coupler. Individual sealed chassis modules can contain one or more electronic components immersed in two-phase coolant that when heated by operation of the electronic components experiences a phase change from a liquid phase to a gas phase and travels to the two-phase condenser tank via the vapor coupler and is cooled in the two-phase condenser tank until experiencing a phase change back into the liquid phase. Individual sealed chassis modules can be decoupled from the two-phase condenser tank without releasing two-phase coolant and an entirety of the multiple sealed chassis modules and the condenser tank are contained in the volume of the rack.

6 Claims, 13 Drawing Sheets

(56) References Cited

U.S. PATENT DOCUMENTS

| | | | |
|---|---|---|---|
| 2010/0103618 A1 | 4/2010 | Campbell et al. | |
| 2011/0069453 A1 | 3/2011 | Campbell et al. | |
| 2011/0315353 A1 | 12/2011 | Campbell et al. | |
| 2011/0317367 A1* | 12/2011 | Campbell | H05K 7/203 |
| | | | 361/700 |
| 2014/0124174 A1 | 5/2014 | Campbell et al. | |
| 2015/0109730 A1* | 4/2015 | Campbell | F28D 15/0266 |
| | | | 165/104.27 |
| 2016/0044833 A1* | 2/2016 | Krishnan | H05K 7/203 |
| | | | 165/80.4 |
| 2016/0240226 A1* | 8/2016 | Shelnutt | H05K 7/203 |
| 2018/0288904 A1* | 10/2018 | Chainer | H05K 7/2029 |
| 2019/0049189 A1* | 2/2019 | Yoon | H05K 7/20663 |

OTHER PUBLICATIONS

"International Search Report & Written Opinion issued in PCT Application No. PCT/US22/023572", dated Aug. 25, 2022, 21 Pages.

\* cited by examiner

COMPUTER COOLING

PRIORITY

This utility application is a non-provisional of, and claims priority to, U.S. Provisional Application 63/183,259 filed on May 3, 2021, which is hereby incorporated by reference in its entirety.

BACKGROUND

Two-phase cooling has been contemplated for various computing devices. However, fluids having suitable properties, such as electrically insulative, non-corrosive, and/or suitable boiling points were unavailable. Relatively recently, suitable fluids have been discovered. These fluids tend to be expensive. They also tend to be biologically harmful, such as to organisms that inhale them and/or they act as greenhouse gases. Existing techniques that use these fluids tend to lose relatively large amounts of these fluids to the environment where they can harm workers and contribute to global warming. For instance, multiple electronic components can be positioned in a large bath or tank that has a condenser region above it. The tank has to be opened to install and/or service the electronic components. Opening the tank releases relatively large amounts of the fluids proximate to the workers, which is immediately potentially harmful to the workers and ultimately to the environment. The present concepts can address these and/or other issues.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the figure and associated discussion where the reference number is first introduced. Where space permits, elements and their associated reference numbers are both shown on the drawing page for the reader's convenience. Otherwise, only the reference numbers are shown.

DETAILED DESCRIPTION

The present concepts relate to two-phase cooling of electronic components, such as processors, memory, and/or storage. Two-phase cooling can remove large amounts of heat per volume of space and thus can allow high electronic component density and performance without overheating. Heat from the electronic components can boil coolant liquid (e.g., liquid phase coolant) into coolant vapor (e.g., gas phase coolant) (hence the term 'two-phase cooling'). The gas phase coolant can carry the heat from the electronic components to a different area of the cooling system where the heat can be transferred to an external cooling system. As a result of the energy transfer, the gas phase coolant returns to the liquid phase. The liquid phase coolant can be recycled to start the cooling process again for the electronic components. However, two-phase cooling can involve cooling fluids (e.g., coolants) that are hazardous to users and/or bad for the environment. As such, it is desired to maintain the coolant in the cooling system and not let the coolant escape where it can harm workers in the vicinity and ultimately the greater environment.

Various two-phase coolants have suitable properties for use in the two-phase cooling systems. Suitable coolants tend to be electrically insulative and non-corrosive. Fluorochemicals provide an example class of coolants that can possess these properties, such as being electrically insulative, non-corrosive, and having suitable boiling points. Commercially available example fluorochemicals include the Novec brand engineered fluids offered by 3M Corp, among others.

Two-phase cooling offers advantages at data centers where high numbers of computing devices, with their various electronic components, run at high performance levels and are physically positioned in close proximity to one another (e.g., at high computing device densities). However, existing two-phase cooling systems have not integrated well into existing data center environments and as a result have not been widely adopted. For instance, the size, shape, and/or position of the existing two-phase cooling systems have not integrated well with existing data center architecture. This lack of integration can cause unwanted coolant releases both from servicing the computing devices and accidental damage to the two-phase cooling systems because of the mismatch with the data center architecture. These and other aspects are described in more detail below.

Figure 1:
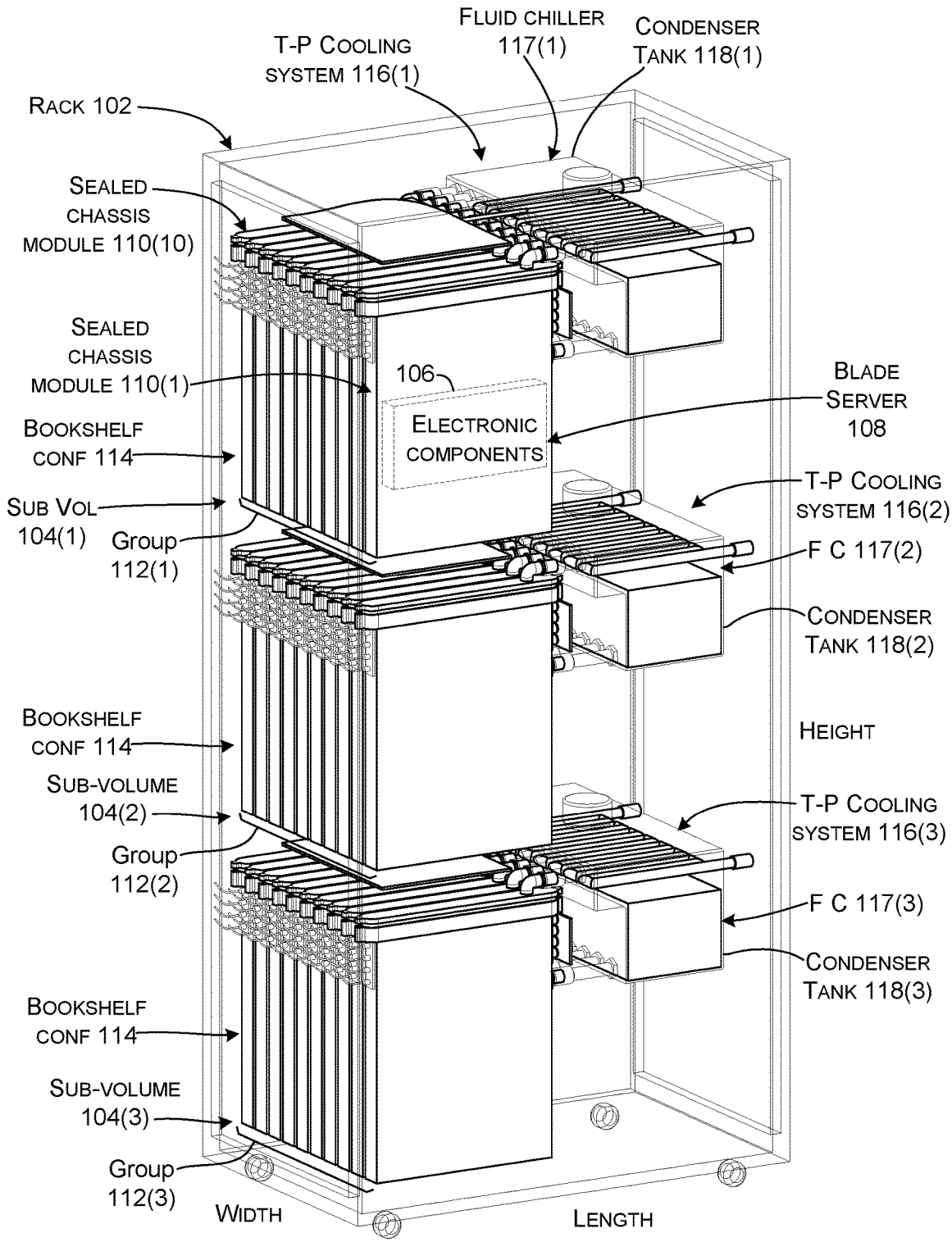
FIGS. 1, 2A, 2B, 3, 4, 5A, 5B, 6, and 7 show perspective views of example devices and systems in accordance with some implementations of the present concepts.
Figure 2A:
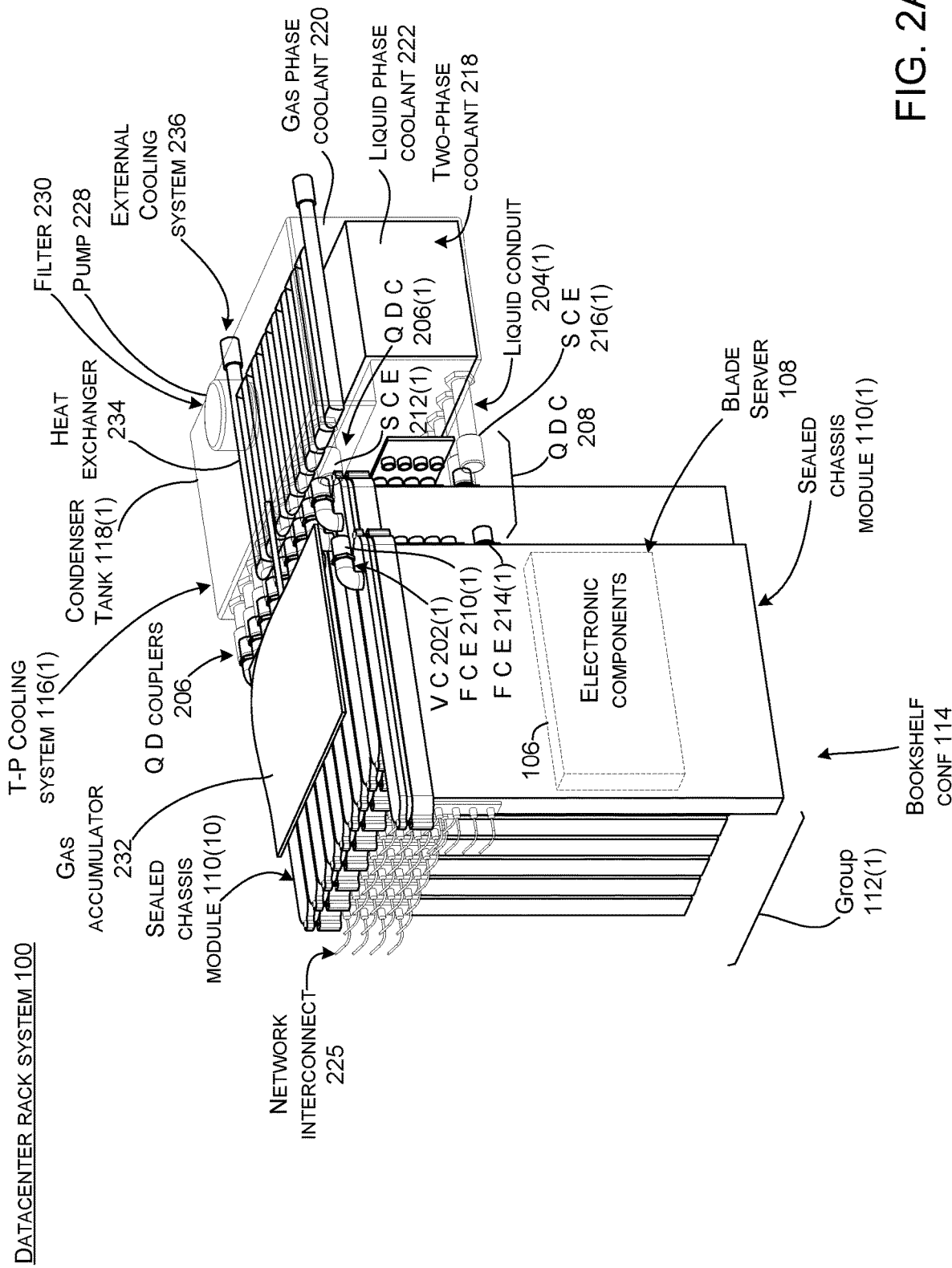
Figure 2B:
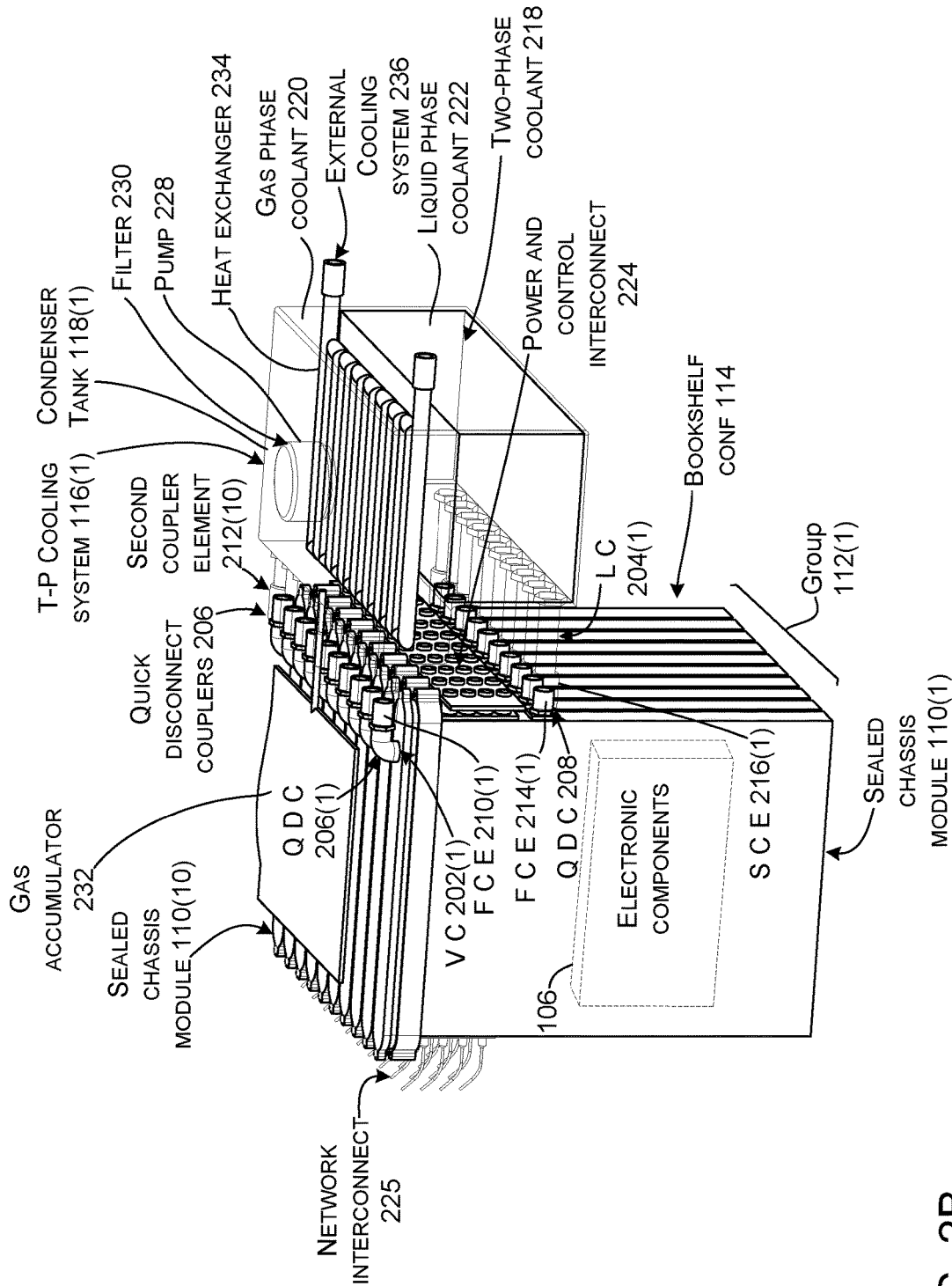

FIGS. 1-2B collectively show example data center rack systems 100. The term 'data center rack system' is employed to aid in conveying implementations in which the present concepts can be employed. The term 'data center' means a physical location that employs and manages multiple computers and thus applies to many use case scenarios. For instance, a data center may be a server farm that provides computing resources for a single entity or multiple entities. Such a data center may provide remote cloud-based computing. In other instances, any entity, such as a health care facility, school, governmental agency, business, etc. can be viewed as including a data center on-site to handle its computing tasks.

The data center rack system 100 can include a rack 102 that defines a volume within the confines of the rack. The volume can be determined by the width, length/depth, and height of the rack. In some cases, rack dimensions have been standardized to allow consistent layout within a data center environment (e.g., building). The present concepts lend themselves to being used with existing standard rack dimensions. In some cases, the rack 102 may define multiple rack units, shelves, or sub-volumes 104 within the overall volume. For instance, FIG. 1 shows the rack defining three vertically arranged sub-volumes 104(1)-104(3).

Electronic components 106 (shown in ghost on FIG. 1 because they would be obstructed in this view), such as processors, memory, and storage can be contained in the volume of the data center rack system 100. The electronic components 106 can be associated as computing devices, such as blade computers or servers 108. In this case, the electronic components 106 and the computing devices are contained in sealed chassis modules 110. In the illustrated configuration of FIG. 1, one computing device is located in each sealed chassis module 110. In another implementation, such as the implementation of FIG. 7 multiple computing devices can be contained in a single sealed chassis module 110. To avoid clutter on the drawing page not all of the sealed chassis modules 110 are specifically designated.

Figure 6:
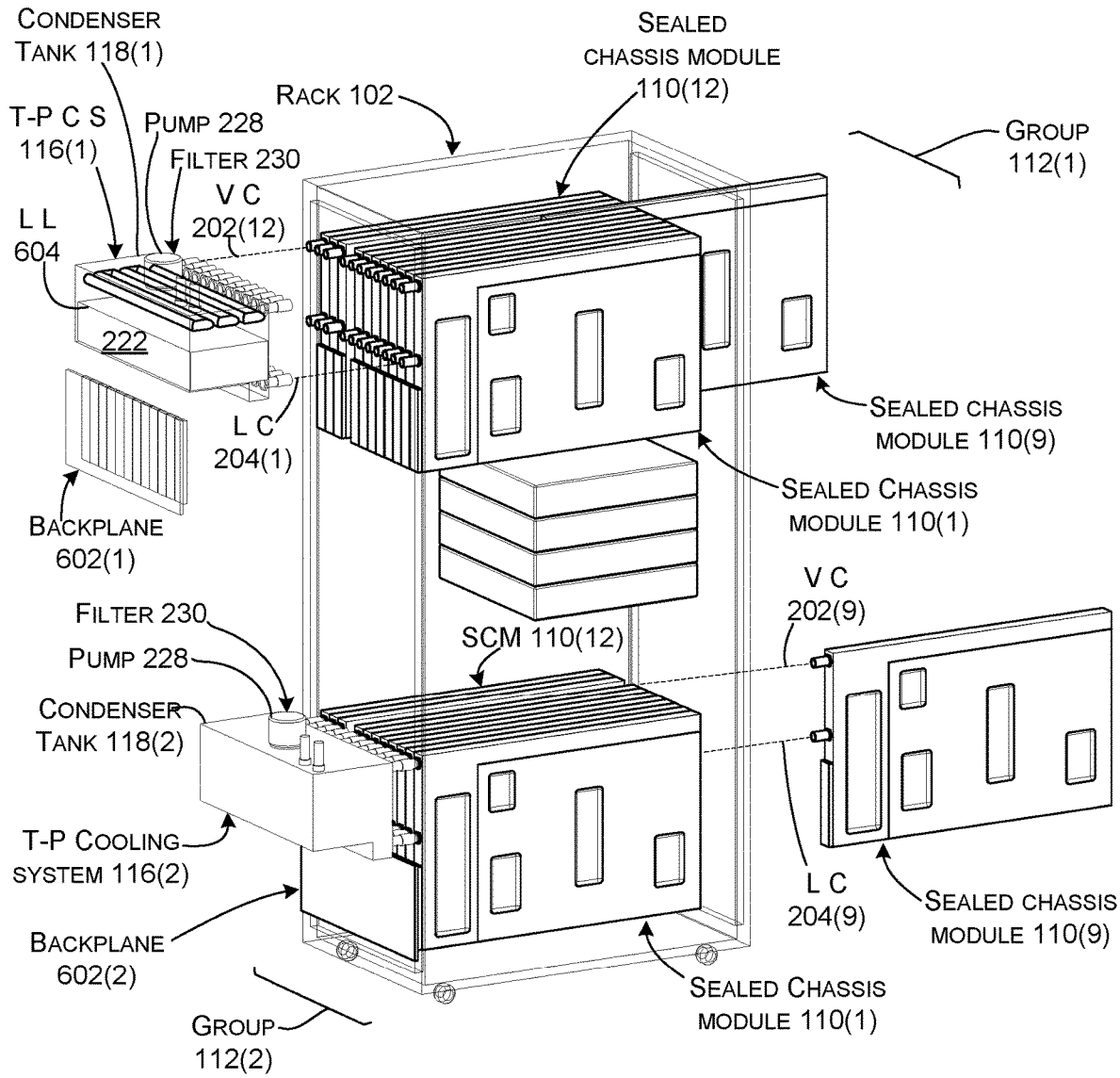

Groups 112 of sealed chassis modules 110 can be associated with an individual rack shelf or sub-volume 104. In the illustrated configuration, the sealed chassis modules 110 can be oriented vertically and grouped in a horizontal row like books in a bookshelf configuration as indicated generally at 114. In this illustrated configuration, each bookshelf configuration 114 includes ten sealed chassis modules 110. In the bookshelf configuration each sealed chassis module 110 can include first and second opposing major planar sides that can be analogized to the front and back covers of the book. Adjacent sealed chassis modules can be juxtaposed with the first major planar side facing the second major planar side of the adjacent sealed chassis module. Other datacenter rack systems 100 can have different numbers of sealed chassis modules 110 grouped together. For instance, FIG. 6 shows an implementation with 12 sealed chassis modules 110 grouped together per bookshelf configuration 114.

The sealed chassis modules 110 can also entail part of a two-phase cooling system 116 that cools the electronic components 106. The two-phase cooling system 116 can include fluid chillers 117. In this case, the fluid chillers 117 can be manifest as two-phase condenser tanks 118. An individual group 112 of sealed chassis modules 110 can share an individual integrated two-phase condenser tank (hereinafter, 'condenser tank') 118 which can be contained entirely within the volume of the rack, in this illustrated implementation.

FIGS. 2A and 2B show details of group 112(1) of chassis modules 110 and two-phase cooling system 116(1). Individual sealed chassis modules 110 can be removably fluidly coupled to the condenser tank 118 via vapor conduits 202 and liquid conduits 204 (specifically designated relative to sealed chassis module 110(1)). Note that FIG. 2A shows sealed chassis module 110(1) decoupled from the condenser tank 118(1), while sealed chassis modules 110(2)-110(10) are fluidly coupled to the condenser tank 118(1). Note also that in FIG. 2B, the condenser tank side of the vapor conduits 202 and liquid conduits 204 are shown in ghost so that the sealed chassis module side of the vapor conduits 202 and liquid conduits 204 are visible.

The vapor conduits 202 can include upper quick disconnect couplers 206 (e.g., dripless blind mate quick disconnects) and liquid conduits 204 can include lower quick disconnect couplers 208. Individual quick disconnect couplers 206 can include a first coupler element 210 on the sealed chassis module side and a second coupler element 212 (designated FIG. 2A) on the condenser tank side. Individual quick disconnect couplers 208 can include a first coupler element 214 on the sealed chassis module side and a second coupler element 216 (designated FIG. 2A) on the two-phase condenser tank side. The first and second coupler elements (210 and 212), (214 and 216) can default to, or be biased to, a closed condition. When a pair of first and second coupler elements are engaged, they open to complete the fluid pathway. When the coupler elements are disengaged, they automatically close and block fluid release. Thus, in some implementations, the quick disconnect couplers can be self-regulating couplers where the term 'self-regulating couplers' means that when the sealed chassis module 110 physically engages the condenser tank (e.g., the vapor conduits 202 and liquid conduits 204 are continuous) the self-regulating couplers automatically open and allow fluid flow. Conversely, when the sealed chassis module 110 is removed (e.g., the vapor conduits 202 and liquid conduits 204 are discontinuous or interrupted) the self-regulating couplers automatically close and block fluid flow.

Other implementations can include quick disconnect couplers that are manually controllable couplers. In these implementations, the first and second coupler elements (210 and 212), (214 and 216) are openable and closable by a technician when servicing the data center rack system. In either case, when an individual sealed chassis module 110 is coupled to the condenser tank 118, the first and second coupler elements (210 and 212), (214 and 216) can fluidly couple the individual sealed chassis module 110 and the condenser tank 118. When an individual sealed chassis module 110 is decoupled from the condenser tank 118, the first and second coupler elements (210 and 212), (214 and 216) can seal the individual sealed chassis module and the condenser tank so that two-phase coolant (hereinafter, 'coolant') 218 is not released. Any release would be limited to coolant (if any) between the first and second coupler elements (210 and 212), (214 and 216). In relation to coolant 218, this explanation may refer to the coolant 218 generally and/or specifically to coolant vapor (e.g., gas phase coolant) 220 (e.g., gas phase or vapor form of the coolant 218) and coolant liquid (e.g., liquid phase coolant) 222 (e.g., liquid phase or liquid form of the coolant 218).

Individual sealed chassis modules 110 can receive liquid-phase coolant 222 from the condenser tank via the liquid conduits 204. The sealed chassis modules 110 can hold liquid-phase coolant 222 at a level that covers the electronic components 106. Electronic components 106 in the sealed chassis modules 110 generate heat during operation. Managing the heat is paramount to the performance and service life of the electronic components 106. The coolant 218 can dissipate heat from the electronic components 106. As mentioned above, the liquid phase coolant 222 can have a boiling point into a gas phase coolant 220 selected for properties of the respective electronic components 106. For instance, coolant 218 can be selected to have a boiling point from liquid phase 222 to gas phase 220 within an operational temperature range of the electronic components 106. For example, the boiling point can be below a specified or designed maximum operating temperature of the electronic components 106.

The sealed chassis modules 110 can receive power for the electronic components 106 through a power and control interconnect 224 (FIG. 2B), among others, and data can be transmitted via a network fiber interconnect 225 (FIG. 2B), among others.

Operation of the electronic components 106 can cause liquid phase coolant 222 to receive thermal energy from the electronic components 106. The liquid phase coolant 222 can rise in temperature and then phase change (e.g., boil) to the gas phase 220. This phase change transfers large amounts of heat from the electronic components 106 to the coolant 218 and automatically carries the heat away as the gas phase coolant 220 rises through the liquid phase coolant in the sealed chassis module 110 and into the condenser tank 118(1).

Some implementations can rely solely on the buoyancy effect of the vapor provided by the phase change to circulate the coolant 218 in the two-phase cooling system. Other implementations may employ a pump 228 to facilitate coolant circulation. The pump 228 can move a mixture of gas phase coolant 220 and liquid phase coolant 222 from the sealed chassis modules 110 to the condenser tank 118(1) and can move liquid phase coolant 222 from the condenser tank 118(1) to the sealed chassis modules 110. In some cases, the pump can be associated with a filter 230. Some of the liquid phase coolant 222 can pass through the filter 230, which can remove various contaminants from the liquid phase coolant 222.

In fixed volume two-phase cooling systems 116, changes in the amount of gas phase coolant 220 can change the pressure (e.g., vapor pressure) within the system. The illustrated implementation can employ a pressure stabilizing mechanism, such as a gas accumulator 232. The gas accumulator 232 can be in gas receiving relation with the condenser tank and can readily inflate or deflate with changes to the amount of gas phase coolant 220. The inflation can increase system volume with increasing gas phase coolant to reduce pressure spikes. Stated another way, an internal volume of the gas accumulator can vary with the pressure in the two-phase coolant system to modulate system pressure.

In the illustrated configuration, the condenser tank 118(1) can be associated with the sealed chassis modules 110 and can be entirely contained in the volume defined by the rack. Existing or traditional configurations have, in contrast, submerged electronic components in a single large tank that does not fit in the rack and has to be opened to access the electronic components. Other existing configurations positioned condenser tanks outside of the racks where they were subject to damage and thus leakage of coolant. Further, the external condenser tanks impinge on walkways between rows of server racks and tend to interfere with data center operations.

The condenser tank 118(1) can be configured to contain both gas phase coolant 220 and liquid phase coolant 222. Namely, the condenser tank can receive gas phase coolant 220 (or a mixture of gas phase coolant 220 and liquid phase coolant 222) from the sealed chassis modules 110. The condenser tank 118(1) can include a heat exchanger or condenser 234 of an external cooling system 236 that transports heat from the rack volume to an external environment. In other implementations, the heat exchanger 234 can transfer heat energy to a liquid cooling system in the data center. In still other implementations, the heat exchanger 234 can be air cooled with air moving in the datacenter. In still other cases, the gas phase coolant 220 could be piped outside of the rack within, or outside of, the datacenter for cooling.

Note also that the illustrated configuration shows a single condenser tank 118 that is fluidly coupled to all of the multiple upright sealed chassis modules 110 of a group 112. However, other configurations are contemplated. For instance, multiple condenser tanks could support a group of chassis modules. For example, a first condenser tank could support a subset of the group, such as the first five sealed chassis modules and a second condenser tank could support another subset, such as the second five. In still other configurations, a condenser tank could be associated with (e.g., dedicated to) each individual two-phase condenser tank in a one-to-one ratio.

Figure 3:
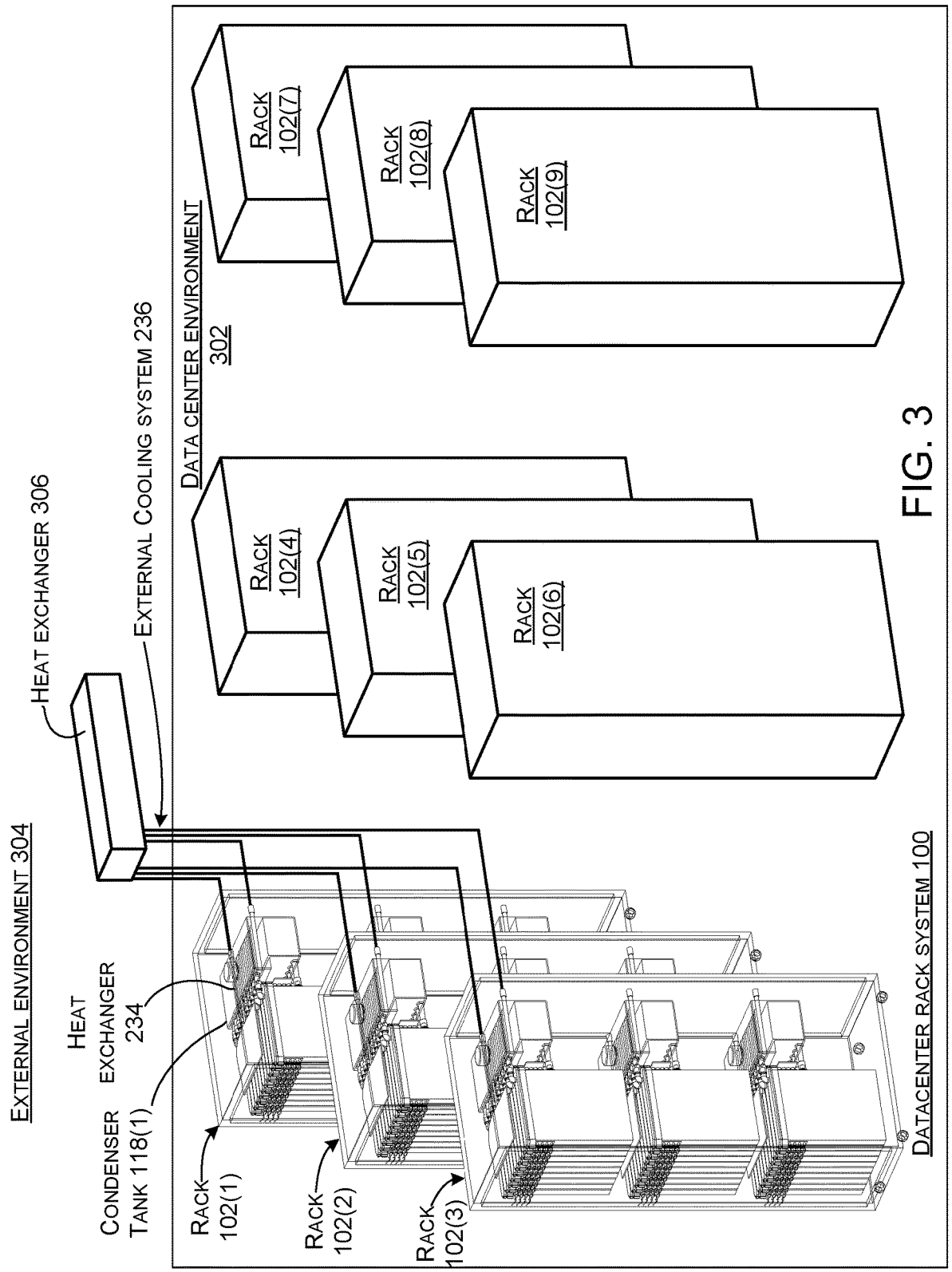

FIG. 3 shows an example external cooling system 236 extending from a datacenter environment 302 to an external environment 304 (e.g., from inside the building to outside the building). Racks 102 are positioned in rows in the datacenter environment 302. The racks 102 can include groups 112 of sealed chassis modules 110 that are fluidly coupled to condenser tanks 118 as described above relative to FIGS. 1-2B. The condenser tanks 118 can include heat exchangers 234. The heat exchangers 234 can be supplied with fluid of external cooling system 236. The fluid of the external cooling system 236 picks up heat from the sealed chassis modules in the condenser tanks 118 and carries the heat to the external environment 304 where the heat can be released, such as via another heat exchanger 306 and the cooled fluid can return to the datacenter environment 302. In this case, fluid tubing of the external cooling system 236 can enter the rack volume and the condenser tank 118.

The heat exchanger can receive heat energy from the gas-phase coolant 220 in the condenser tank 118. This heat exchange can allow the gas-phase coolant to reduce its thermal load (e.g., thermal energy) sufficient to undergo a phase change back into liquid phase coolant 222. The liquid phase coolant can be returned to the sealed chassis modules 110 to start the electronic component cooling process again. The external cooling system 236 can carry this received heat energy out of the data center environment 302 and transfer the heat energy to an external environment 304.

As can be appreciated from viewing FIGS. 1-3 collectively, in this implementation, the two-phase cooling system 116 can be contained entirely within the volume defined by the rack 102. Thus, the two-phase cooling system 116 is physically protected by the rack 102 from damage that can occur outside of the rack, such as when racks are moved and/or when technicians and/or materials are moved past the racks in the intervening aisles.

The external cooling system 236 does not contact the electronic components 106 and as such does not need to have the same properties as the coolant 218 contained in the two-phase cooling system 116. Accordingly, the external cooling system 236 can employ water as the cooling fluid. Therefore, any cooling system damage outside the racks, such as breaks or leaks can only produce water leaks, which may be innocuous compared to leakage of coolants 218 from a regulatory perspective. (It is recognized that from a chemical perspective water may function as a two-phase coolant in the external cooling system in some implementations. However, to avoid ambiguity, in this document, 'two-phase coolant' refers to coolants in the two-phase cooling system 116 that contact the electronic components 106 and not to the coolant employed in the external cooling system 236.)

The discussion above explains how the present concepts maintain the coolant 218 within the racks 102 and thus prevent extra-rack (e.g., outside the rack) two-phase fluid loss. The discussion below explains how the present concepts also reduce/prevent coolant loss within the rack.

As introduced above, FIG. 2A shows the self-regulating couplers 206 and 208 (e.g., dripless blind mate quick disconnects) can allow either or both of individual sealed chassis modules 110 and/or the condenser tank 118 to be replaced with little or no coolant release. In some configurations, the sealed chassis modules 110 and/or the two-phase condenser tank 118 can be hot swappable (e.g., replaced while the group of computing devices coupled to that condenser tank in other sealed chassis modules 110 continue to perform computing operations). For instance, if an individual sealed chassis module ages out or otherwise should be serviced, the individual sealed module can be electrically disconnected from the power and control interconnects 224 and the network interconnects 225.

The individual sealed chassis module 110 can be physically horizontally withdrawn from the rack (analogous to removing a book from a shelf). In some implementations, this movement will automatically disengage the quick disconnect couplers 206 and 208, which will automatically close to prevent coolant 218 release from both the sealed chassis module 110 and the condenser tank 118, respectively. Another (e.g., replacement) sealed chassis module can be physically positioned in its place. This physical positioning will engage the quick disconnect couplers (e.g., cause them to open) and allow fluid flow between the two-phase condenser tank 118 and the replacement sealed chassis module 110.

In the implementation shown in FIGS. 1-3 the two-phase cooling system 116 is positioned laterally from the group 112 of sealed chassis modules 110. In the illustrated configuration, the two-phase cooling system 116 is laterally adjacent to the group 112 of sealed chassis modules 110. The top of the two-phase cooling system 116 is approximately level with the top of the group of sealed chassis modules 110. An alternative configuration is discussed next.

Figure 4:
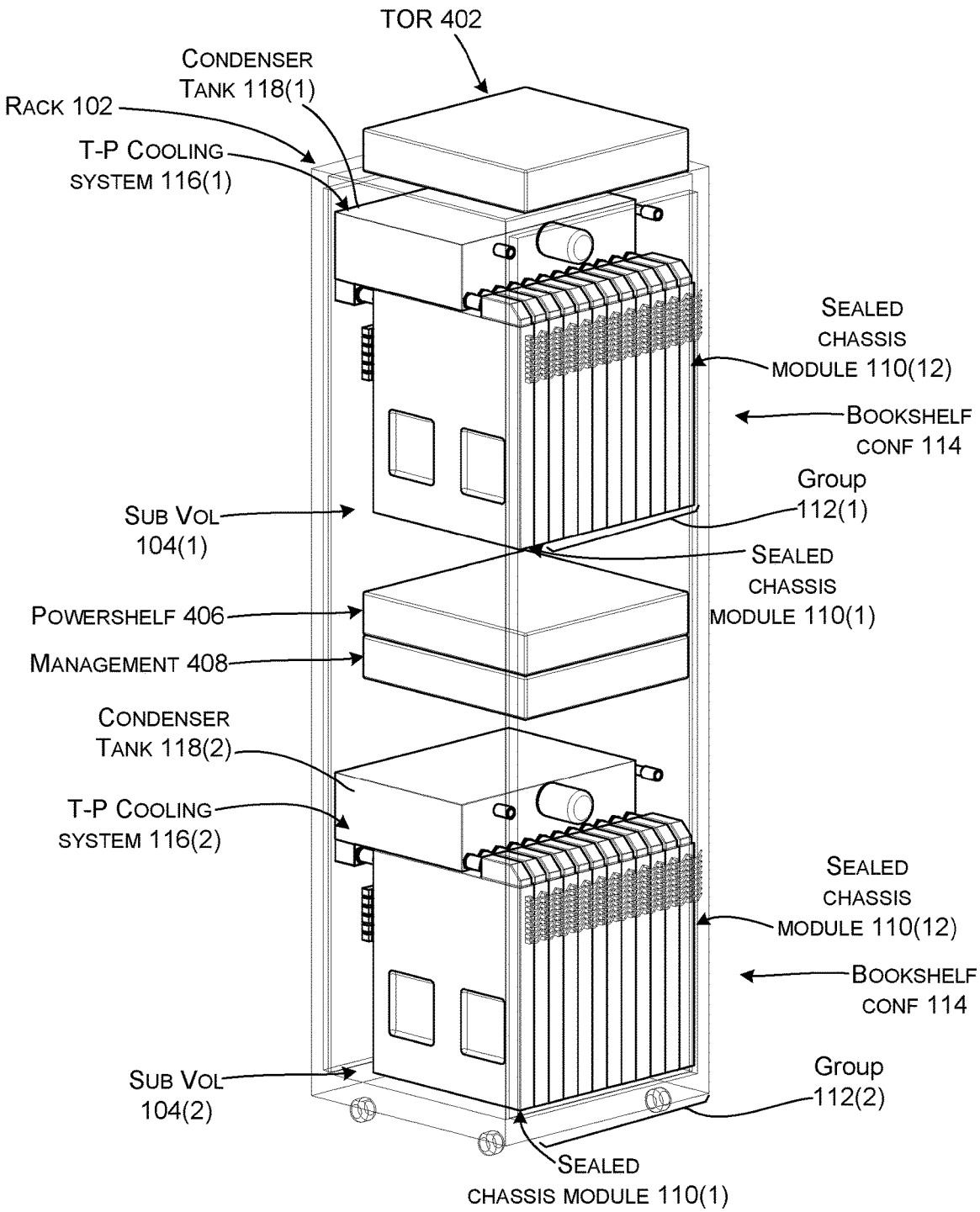
Figure 5A:
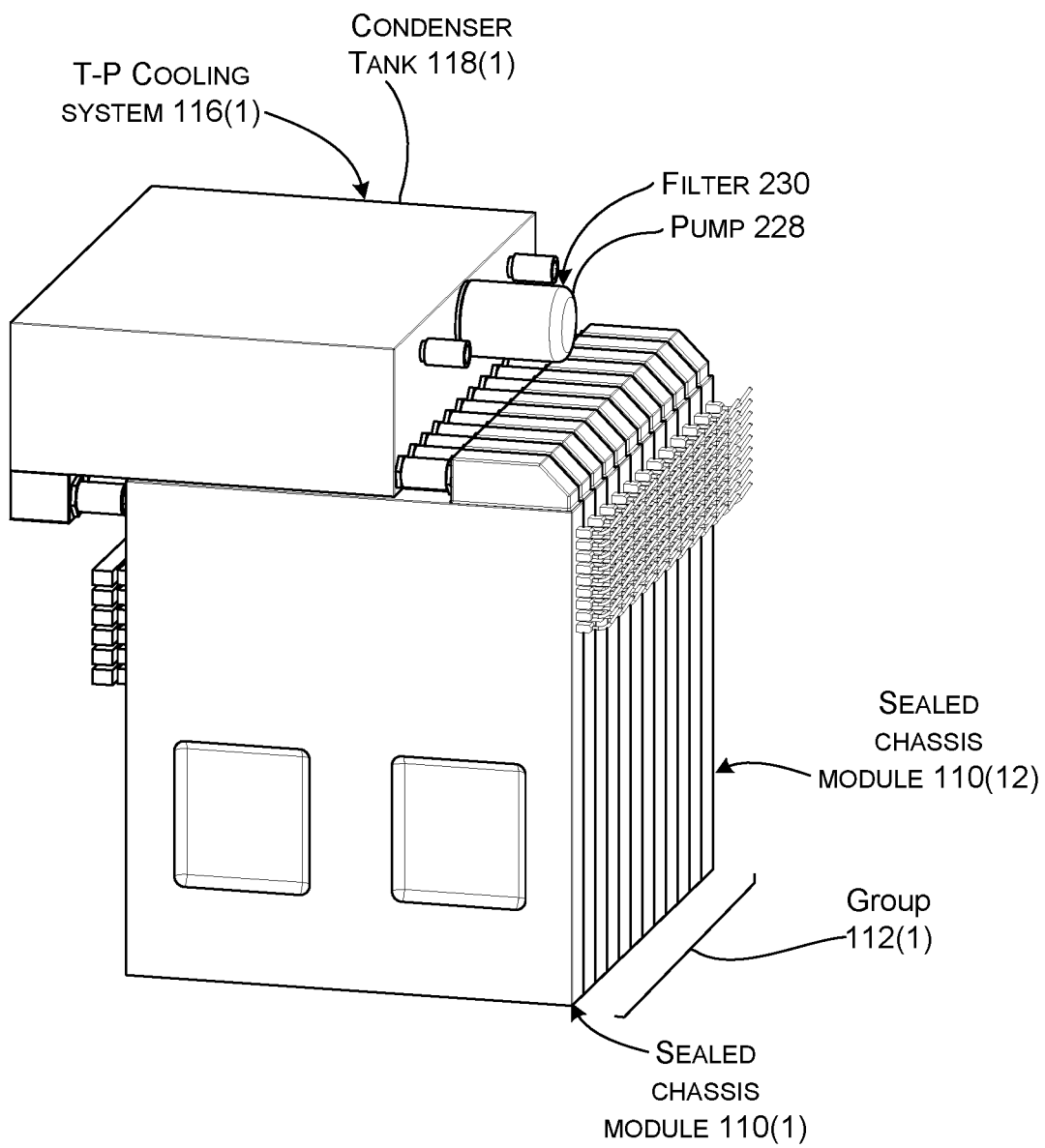
Figure 5B:
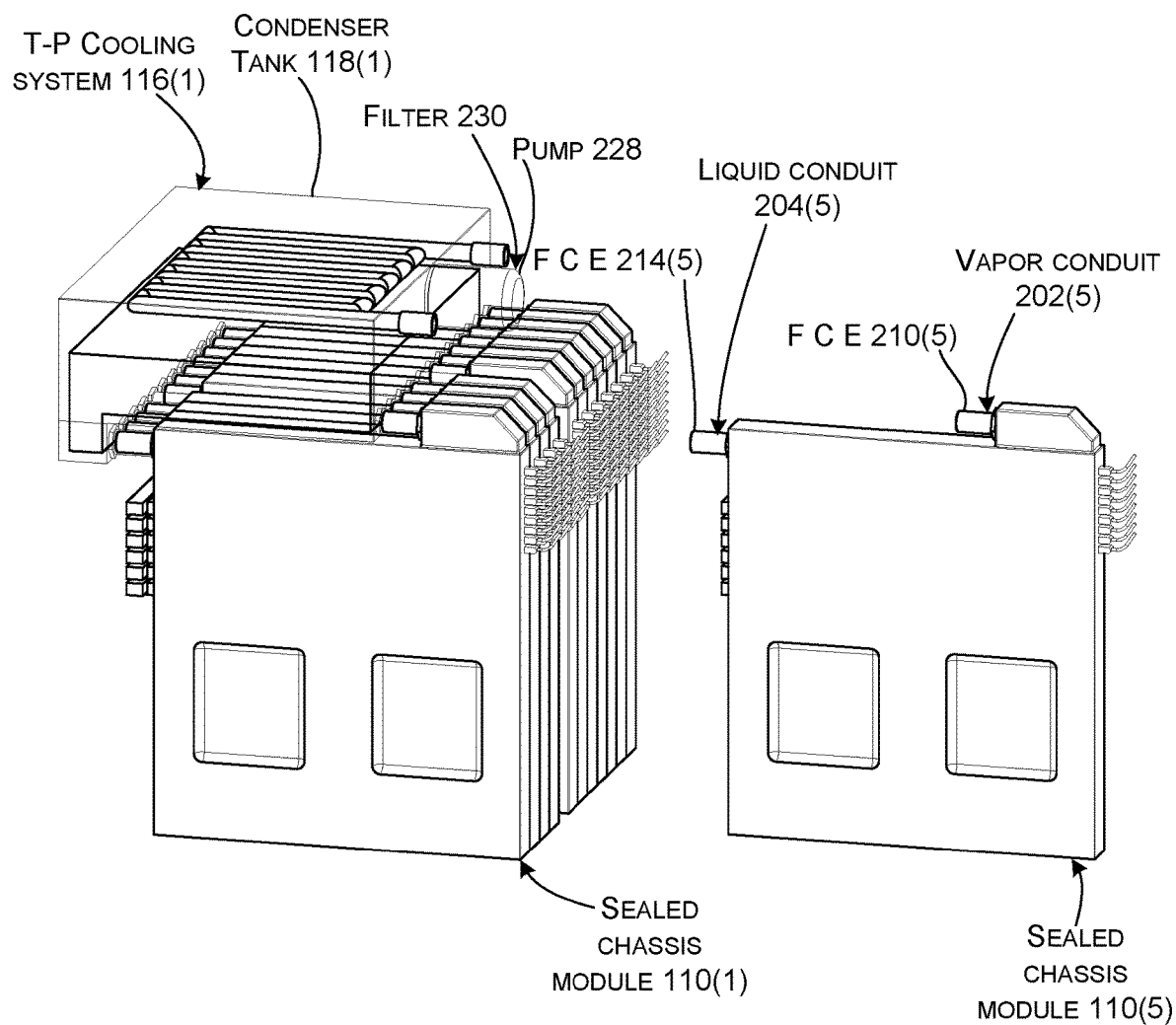

FIGS. 4, 5A, and 5B collectively show an alternative datacenter rack system 100A. This example includes two groups 112 of sealed chassis modules 110 in bookshelf configurations 114. In this case, each group 112 includes 12 sealed chassis modules 110. The two groups 112 are vertically stacked relative to one another in the rack 102. In this implementation, the cooling tank 118 that supports an individual group (e.g., is fluidly coupled to the sealed chassis modules of the group) is generally positioned over the group 112.

FIG. 5B shows an individual sealed chassis module 110(5) being hot swapped while the other sealed chassis modules 110 can continue to function. With sealed chassis module 110(5) removed, vapor conduit 202(5) with its first coupling element 210(5) is visible. Similarly, liquid conduit 204(5) with its first coupling element 214(5) is also visible.

This implementation can employ pumps 228 and/or filters 230. In this case, the pump 228 and filter 230 can be manifest as a single assembly that can be hot swappable while the sealed chassis modules 110 continue to function. Also, the pump 228 can cause a mix of gas phase coolant 220 and liquid phase coolant 222 to travel through vapor conduit 202(5). The filter 230 can remove contaminants from the liquid phase coolant 222 before it is returned to the sealed chassis modules 110 via the liquid conduit 204.

This example also shows supporting components, such a top of rack (TOR) switch 402, a powershelf component 404, and a management component 406. Other supporting components associated with rack function are contemplated.

FIG. 6 shows another alternative datacenter rack system 100B. This example includes two groups 112 of sealed chassis modules 110 in bookshelf configurations 114. In this case, each group 112 includes 12 sealed chassis modules 110. The two groups 112 are vertically stacked relative to one another in the rack 102. Sealed chassis modules 110 of an individual group 112 can connect to a unified power and input/output backplane 602. Backplane 602(1) is shown spaced away from the rack relative to group 112(1) and backplane 602(2) is shown installed relative to group 112(2).

In this implementation, the condenser tank 118 that supports an individual group (e.g., is fluidly coupled to the sealed chassis modules of the group) is generally positioned laterally adjacent to the group 112. In this example, the condenser tanks 118 are positioned outside the rack 102 (e.g., not within the rack volume). This configuration can provide ease of access and serviceability of the two-phase cooling system 116, such as the pump 228 and filter 230. In this example, the pump and filter can be hot-swappable while the electronic components of the sealed chassis modules 110 continue to function.

Similarly, individual sealed chassis modules 110 can be hot-swappable while the other sealed chassis modules 110 of the group 112 continue to function. This is illustrated by sealed chassis module 110(9) of both group 112(1) and 112(2) being decoupled while the other sealed chassis modules 110 remain fluidly coupled and functioning. The hot swapping capability is enabled at least in part by the sealable nature of the vapor conduits 202 and the liquid conduits 204. In FIG. 6, relative to group 112(1), vapor conduit 202(12) is specifically designated as well as liquid conduit 204(1) and relative to group 112(2), vapor conduit 202(9) and liquid conduit 204(9) are specifically designated.

While not specifically designated on FIG. 6 to avoid clutter on the drawing page, the vapor conduits 202 and the liquid conduits 204 can include first coupler elements on the sealed chassis module side and second coupler elements on the condenser tank side. The coupler elements can function to seal the module side and the tank side of the conduits so that no coolant escapes when sealed chassis modules are coupled and decoupled. This can be accomplished even though in the case of the liquid conduit 204, the liquid level 604 (shown on condenser tank 118(1)) of the liquid phase coolant 222 is above the liquid conduit 204. Hence, liquid phase coolant 222 would pour out when an individual sealed chassis module 110 is decoupled if not for the coupler elements. As mentioned above, coupler elements can automatically open when the vapor conduits and liquid conduits are completed and automatically close when the vapor conduits and liquid conduits are discontinuous (e.g., when the sealed chassis module is removed).

Figure 7:
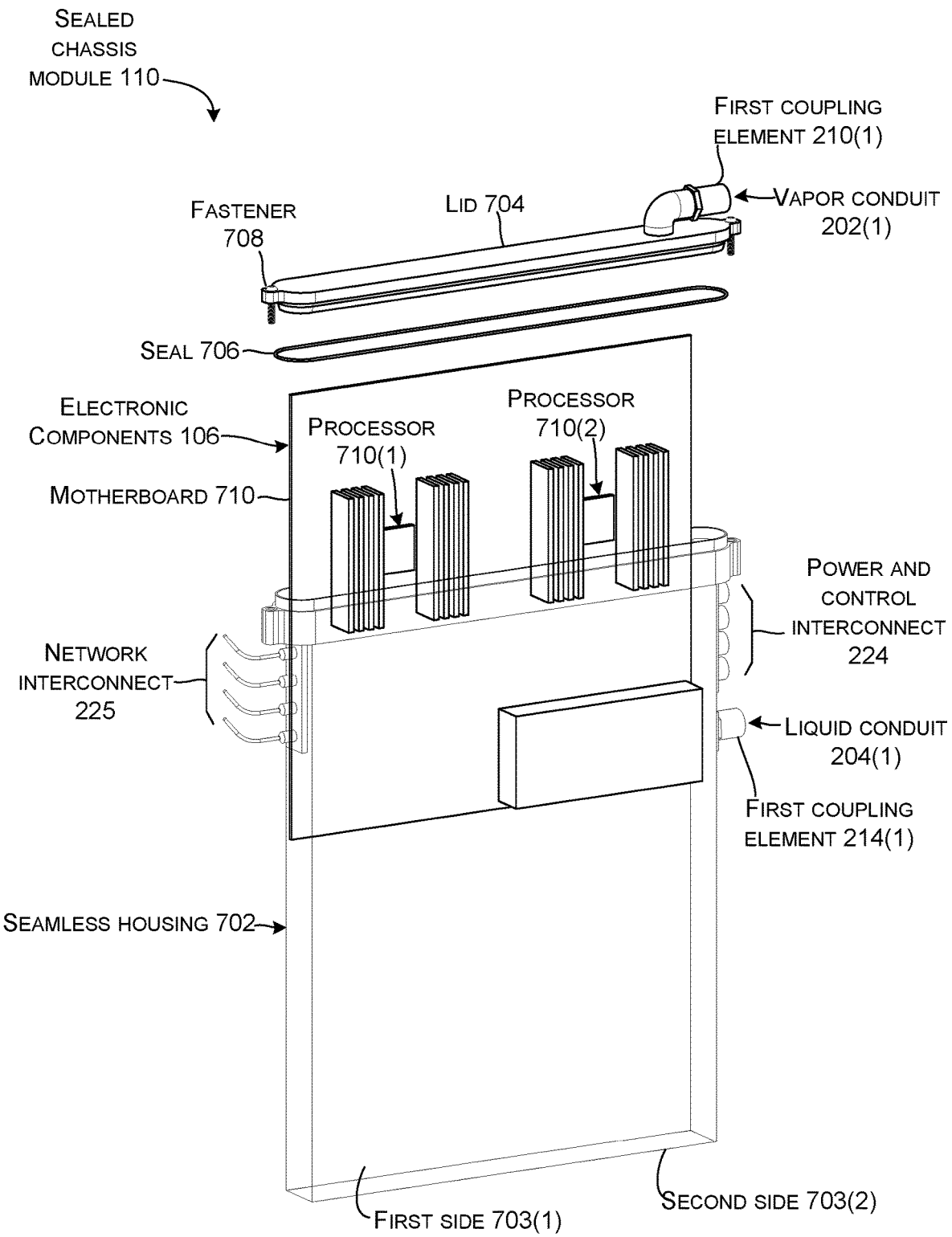

FIG. 7 is an exploded view of an example configuration for sealed chassis module 110. In this case, the sealed chassis module can include a seamless housing 702 that can define a volume between first and second spaced apart major sides 703(1) and 703(2). The sealed chassis module 110 can also include a lid 704 that is secured to the seamless housing 702 around a seal 706 by fasteners 708. In this case the electronic components 106 contained in the sealed chassis module 110 can include a motherboard 710 with multiple processors 712 positioned on the motherboard 710. Individual processors 712 can represent a computer functionality (e.g., a computer). As such, the motherboard 710 can include multiple processors 712 and hence multiple computer functionalities within a single sealed chassis module 110. The illustration shows two processors 712 in a single horizontal row, but any number can be employed. For instance, processors 712 can be positioned on both sides of the motherboard 710 and/or multiple rows of processors 712 could be arranged on the motherboard.

Figure 8A:
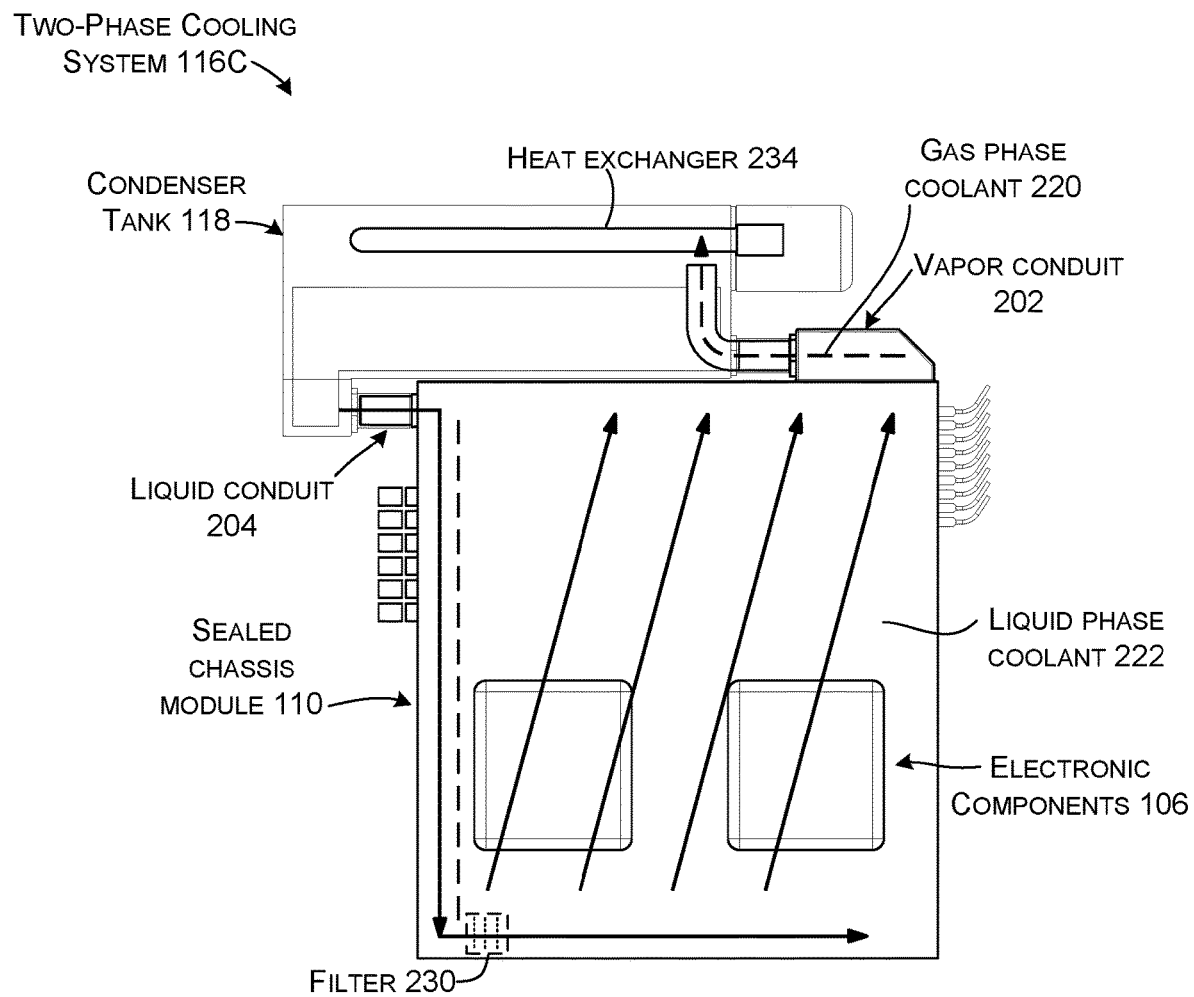
FIGS. 8A and 8B show elevational views of example devices and systems in accordance with some implementations of the present concepts.
Figure 8B:
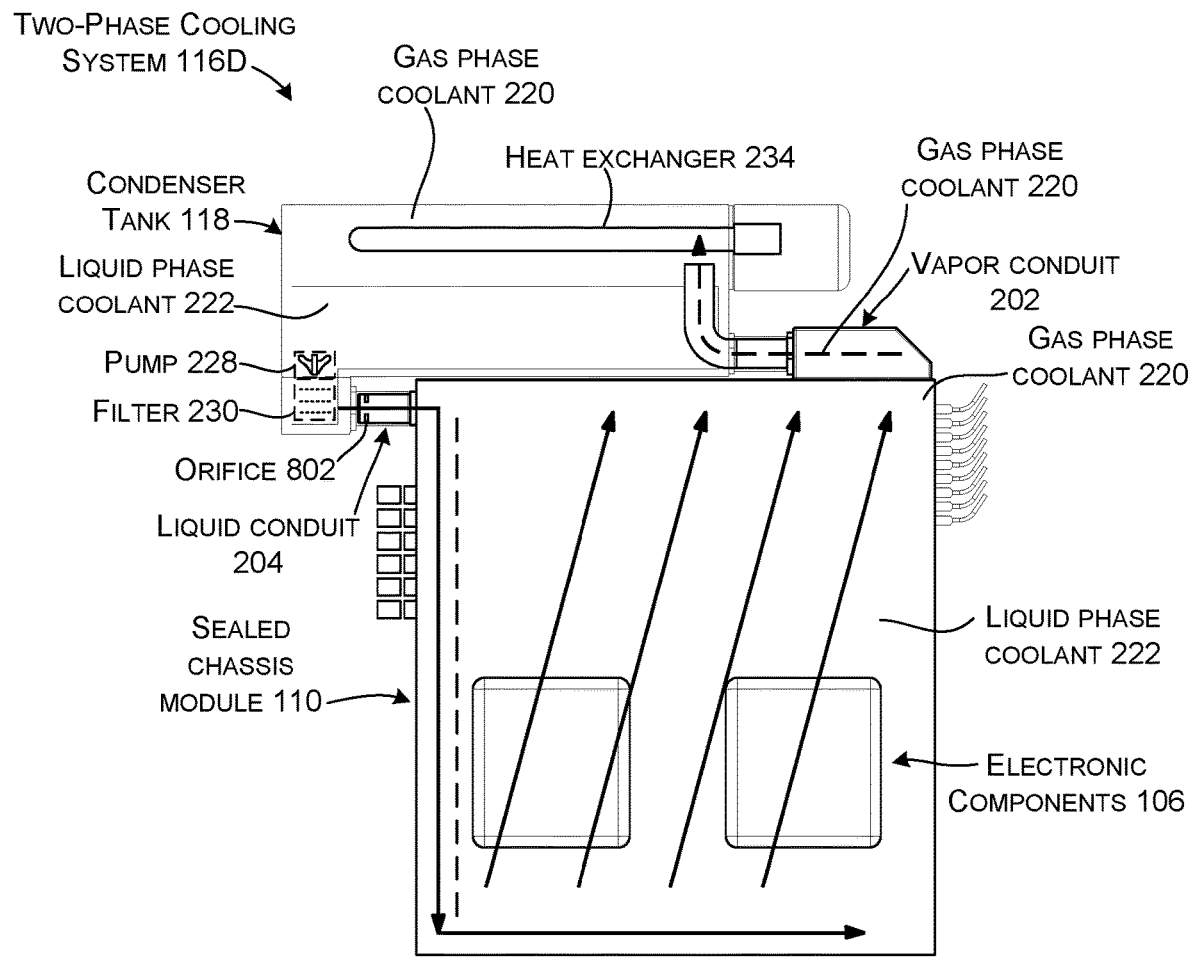

FIGS. 8A and 8B show details of fluid flow through example two-phase cooling systems 116. Two fluid flow mechanisms have been mentioned above and are described in more detail here. FIG. 8A shows one fluid flow mechanism can rely at least in part on buoyancy effect related to phase change of the coolant in the sealed chassis module 110. From one perspective this can be viewed as 'passive' flow or circulation in that energy is not added to the system specifically to move fluid. FIG. 8B shows the other fluid flow mechanism can involve active pumping of cooling fluid, such as with a pump and can viewed as an 'active' system. Note that either of these configurations can employ a gas accumulator, the function of which is described above relative to FIGS. 2A and 2B and is not re-emphasized here.

FIG. 8A shows two-phase cooling system 116C that can rely on passive flow of coolant 218. Recall that the electronic components 106 can be immersed in liquid phase coolant 222. Electrical activity of electronic components 106 produces heat energy that can be absorbed by liquid phase coolant 222 and cause some of the liquid phase coolant to warm and undergo phase change (e.g., boils) to gas phase coolant 220. The gas phase coolant rises through the remaining liquid phase coolant toward the top of the sealed chassis module 110 and into the vapor conduit 202. The gas phase coolant 220 passes through the vapor conduit 202 into the condenser tank 118 where it contacts the heat exchanger 234. The gas phase coolant 220 transfers heat to the heat exchanger until its thermal energy is low enough to phase change back to the liquid phase coolant 222. This liquid phase coolant in the condenser tank 118 can get a gravity assist to flow back down into the sealed chassis module 110 where it tends to flow to the bottom because its density is relatively high compared to the mixture of liquid phase coolant and gas phase coolant in the sealed chassis module in the presence of the electronic components 106. As the liquid phase coolant is heated by the electronic components it tends to rise and circulate in the sealed chassis module 110 until it boils again and the process is repeated.

In some of these implementations, the sealed chassis module may include filters 230 positioned in the liquid phase coolant 222 to trap contaminants. This passive configuration does not rely on any active components for circulation and thus may be extremely reliable. Further, the phase change driven mechanism works even if the liquid phase coolant levels change as long as the electronic components are immersed in the liquid phase coolant 222.

FIG. 8B shows two-phase cooling system 116D that can employ active circulation, such as provided by pump 228. Note that this design can still leverage passive flow of coolant 218, but can augment this process with additional fluid pumping. In this case, pump 228 can create a force or pressure on liquid phase coolant 222, such as in the condenser tank 118. This pressure can drive liquid phase coolant 222 through the optional filter 230 and the liquid conduit 204 into the sealed chassis module 110. This liquid movement tends to create a relative positive pressure in the sealed chassis module 110 such that gas phase coolant 220 and potentially some liquid phase coolant 222 pass through the vapor conduit 202 and into the condenser tank 118. The gas phase coolant 220 can be condensed/cooled by the heat exchanger 234 until it phase changes back into liquid phase coolant 222 and the process can repeat. This configuration can produce a predictable flow rate. A predictable flow rate can carry a calculatable amount of heat. Thus, the heat dissipating capacity is known and can be used as a control parameter when operating the electronic components 106.

In the illustrated configuration, each liquid conduit 204 can include an orifice 802. The orifice 802 can function to limit flow through an individual sealed chassis module 110 so that the positive pressure provided by pump 228 can provide adequate liquid coolant flow through each sealed chassis module. Stated another way, having an orifice 802 on each sealed chassis module 110 limits the extent to which the liquid can flow through the path of least resistance and ensures that each sealed chassis module 110 gets a minimal flow that can be defined by the pressure developed by the pump and the cross-sectional area of the orifice.

Further, note that many contaminants tend to be dissolved in liquid phase coolant 222 and do not evaporate and travel with the gas phase coolant 220. Because this active configuration tends to circulate at least some liquid phase coolant 222 from the sealed chassis modules 110 back to the two-phase condenser tank 118, this configuration can also allow a central filter 230 to be employed in the condenser tank 118 rather than in individual sealed chassis modules 110.

Note that the discussion above emphasizes two-phase cooling. However, implementations that employ pump assisted circulation can work with single phase cooling (e.g., the liquid does not boil as it circulates through the system past the electronic components). In such a case, the fluid chiller (117, FIG. 1) can be configured to receive coolant, such as liquid phase coolant from the sealed chassis modules. The fluid chiller can be configured to cool the coolant by transferring heat from the coolant to the external cooling system (236, FIG. 2A). The 'cooled coolant' can be returned to the sealed chassis modules where it once again is heated by the electronic components before traveling back to the fluid chiller. Stated another way, the 'fluid chiller' is a mechanism that removes heat from the coolant and thus lowers the temperature of the coolant and/or changes a phase of the coolant. The fluid chiller can transfer this heat to another media, such as air or water that is external to the rack.

Figure 9:
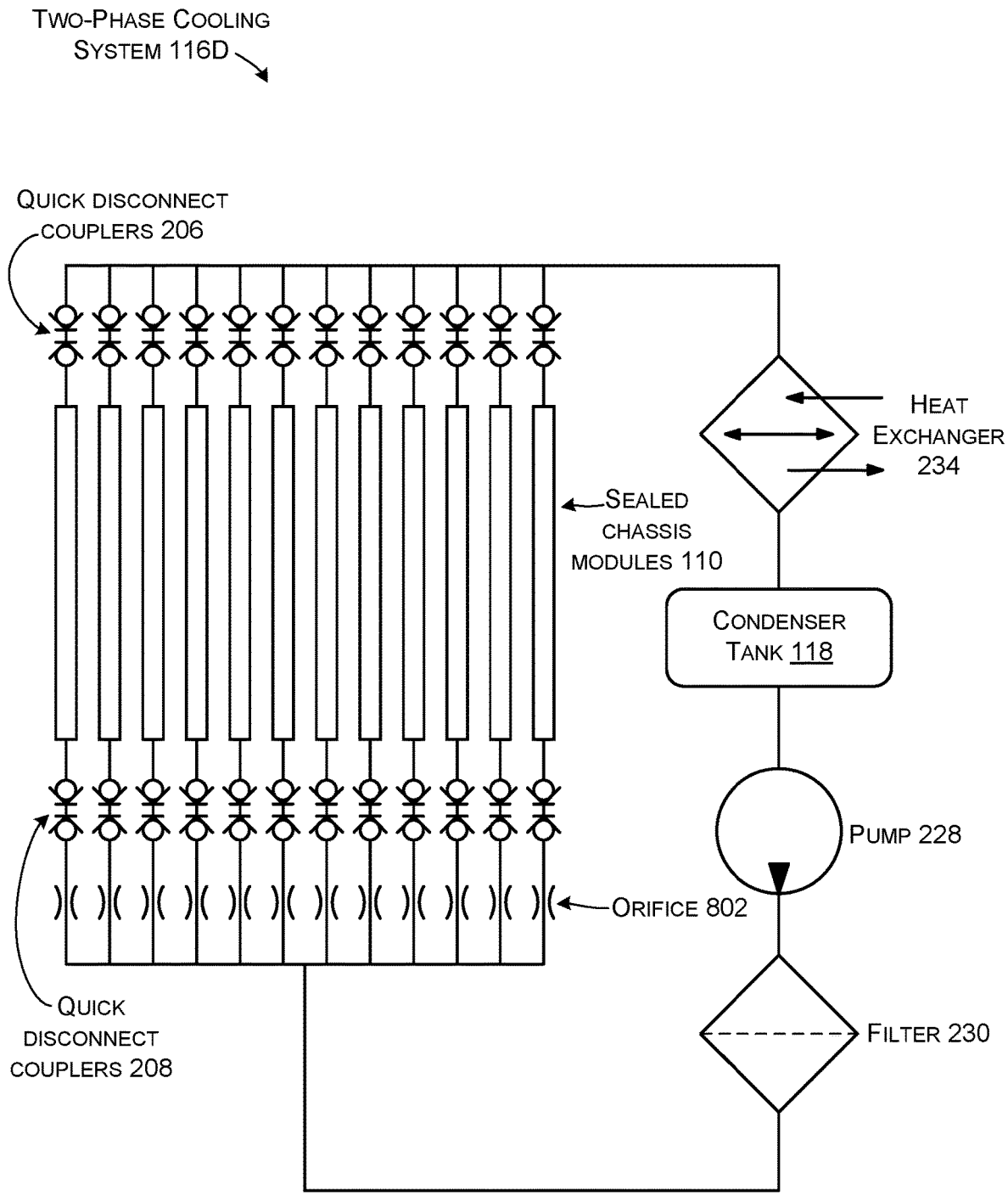
FIG. 9 shows a schematic view of example devices and systems in accordance with some implementations of the present concepts.

FIG. 9 shows a system schematic of the active circulation two-phase cooling system implementation described in FIG. 8B. In this example, a mixture of gas phase coolant and hot liquid phase coolant can exit the sealed chassis modules 110 and pass through the vapor conduit quick disconnect couplers 206. This mixture is condensed and/or cooled by the heat exchanger 234 until it is all or mostly liquid phase coolant in the condenser tank 118. The pump 228 moves (some or all of) the liquid phase coolant through the filter 230 and through the liquid conduits' quick disconnect couplers 208. Individual sealed chassis 110 can be removed from the system by physically disengaging the sealed chassis module from the system, which can cause the quick disconnect couplers 206 and 208 to close the fluid conduits to prevent leakage. As mentioned above, manual valves can be employed instead of automatic or self-regulating quick disconnect couplers. As also mentioned above, orifices 802 can be sized in accordance with the pump 228 to ensure that all sealed chassis modules 110 receive at least a predefined liquid flow that is adequate for cooling its electronic components according to their operational parameters.

The present concepts offer hermetically sealed chassis modules 110 that can contain electronic components 106 in the form of one or a few computing devices (e.g., computer functionalities), such as 1-12 computing devices for example. The hermetically sealed chassis modules can be hot swappable modules in the form of a Field Replaceable Unit (FRU). In illustrated implementations, blades (e.g., sealed chassis modules) can be inserted and removed in a horizontal manner. A set or group of chassis modules can be arranged on a shelf or chassis layer. The set of chassis modules can share a condenser tank. The set of chassis and the common condenser tank can be entirely contained in a standard rack footprint (e.g., an entirety of the set of chassis and the common condenser tank can fit in a volume or sub-volume of the rack). Stated another way, the components associated with the coolant can be maintained entirely within the volume defined by the rack and the rack can be a standard rack size, such as 19 inch or 21 inch, among others, that is presently employed in data centers.

The present concepts can offer a data center rack system as a sealed system where the coolant is not exposed to the air or the technician. Fluid, power, and control connections to the sealed chassis modules can be blind connections.

Some implementations can employ conformal sealed chassis modules and condenser tanks to reduce/minimize the volume of fluid employed. In some cases, the condenser tank can be above the sealed chassis modules, behind the sealed chassis modules, on the side of the rack, or remote. Various coolant circulation techniques can be employed. For instance, submerged boiling, thermosiphon, or pumped techniques can be employed. Power can be supplied to the datacenter rack system via internal submersed AC/DC power or external AC/DC supplies in air or immersion housings. Sealed chassis modules can be connected to the condenser tank by blind quick disconnects or manual valves, among others.

The data center rack system lends itself to manual (e.g., technician) insertion and removal of sealed chassis modules without releasing the coolant. The data center rack system can also facilitate robotic blade insertion/removal. Sealed chassis modules can simply be removed and replaced without releasing coolant. The removed sealed chassis module can be repaired at an appropriate service site where any coolant that escapes during service of the sealed chassis module can be captured and reused.

Figure 10:
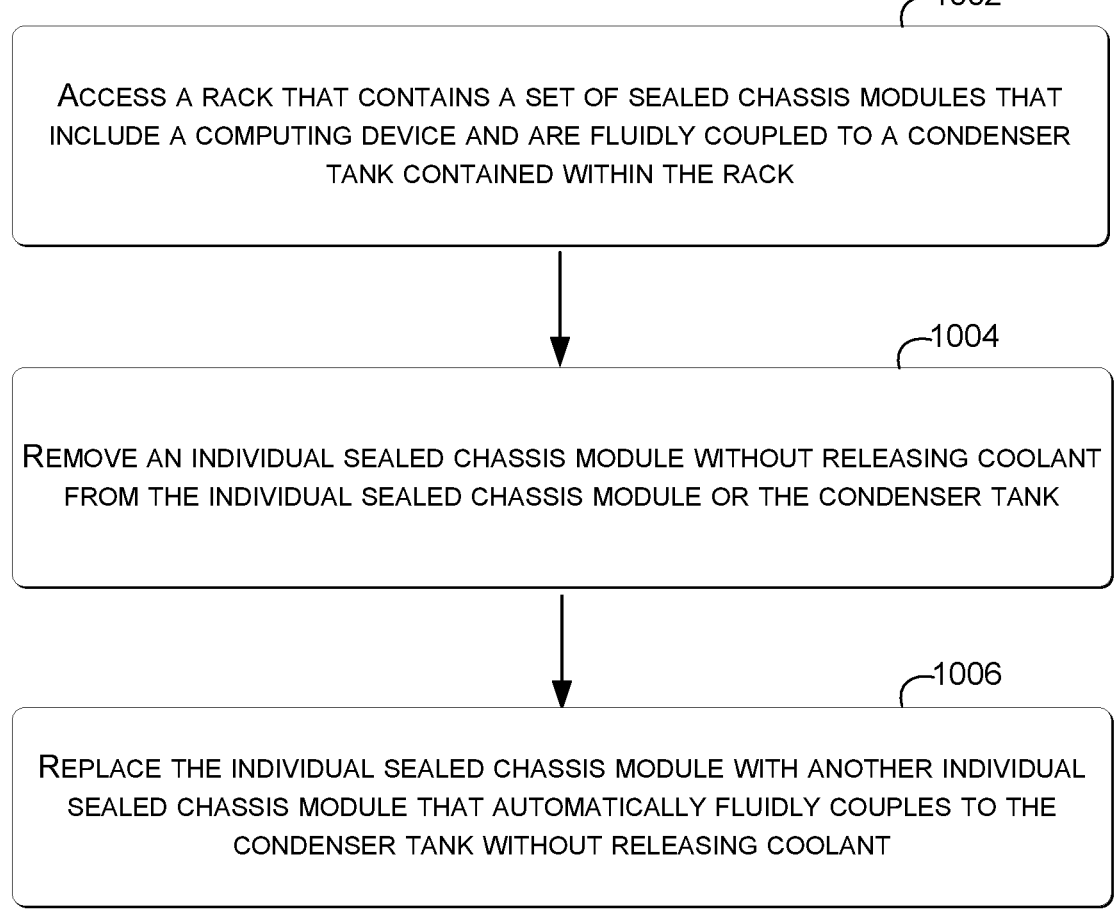
FIG. 10 shows a flowchart of an example method in accordance with some implementations of the present concepts.

FIG. 10 shows an example flowchart of a two-phase liquid cooling technique or method 1000.

At 1002, the method can access a rack that contains a set of sealed chassis modules that include a computing device (e.g., blade server) and are fluidly coupled to a condenser tank contained within the rack.

At 1004, the method can remove an individual sealed chassis module without releasing coolant from the individual sealed chassis module or the condenser tank. The term 'without' can mean that no coolant is released or that only a very small amount of coolant that may be located between adjacent coupler elements (e.g., valves) is released.

At 1006, the method can replace the individual sealed chassis module with another individual sealed chassis module that automatically fluidly couples to the condenser tank without releasing coolant.

In some cases, an associated process can involve moving computing functions from the individual sealed chassis module to other sealed chassis modules so that the individual sealed chassis module can be removed. The method can then re-allocate computing functions to the replacement sealed chassis module upon installation.

The described methods can be performed by the systems and/or elements described above and/or below, and/or by other devices and/or systems and/or technicians working on these systems, devices, and/or elements.

The order in which the methods are described is not intended to be construed as a limitation, and any number of the described acts can be combined in any order to implement the method, or an alternate method. Furthermore, the methods can be implemented in any suitable hardware, software, firmware, or combination thereof, such that a device can implement the method. In one case, the method is stored on one or more computer-readable storage medium/media as a set of instructions (e.g., computer-readable instructions or computer-executable instructions) such that execution by a processor causes the processor to perform the method.

Various examples are described above. Additional examples are described below. One example includes a system comprising a rack defining a volume and multiple sealed chassis modules removably fluidly coupled to a two-phase condenser tank via a vapor coupler and a liquid coupler, individual sealed chassis modules containing one or more blade computers immersed in two-phase coolant that when heated by operation of the blade computer experiences a phase change from a liquid phase to a gas phase and travels to the two-phase condenser tank via the vapor coupler and is cooled in the two-phase condenser tank until experiencing a phase change back into the liquid phase, and wherein individual sealed chassis modules can be decoupled from the two-phase condenser tank without releasing two-phase coolant, and wherein an entirety of the multiple sealed chassis modules and the condenser tank are contained in the volume of the rack.

Another example can include any of the above and/or below examples where the two-phase condenser tank is positioned above the multiple sealed chassis modules or wherein the two-phase condenser tank is horizontally adjacent to the multiple sealed chassis modules.

Another example can include any of the above and/or below examples where the system further comprises a gas accumulator in gas receiving relation with the two-phase condenser tank, the gas accumulator having an internal volume that varies with a vapor pressure within the two-phase condenser tank.

Another example can include any of the above and/or below examples where the system further comprises a pump that facilitates movement of some of the gas phase coolant and some of the liquid phase coolant from the individual sealed chassis modules through the vapor coupler into the two-phase condenser tank.

Another example can include any of the above and/or below examples where the system further comprises a filter associated with the pump that facilitates removal of contaminants from the liquid phase coolant.

Another example can include any of the above and/or below examples where the system relies on vapor pressure from the phase change from liquid phase to gas phase to circulate the two-phase coolant between the individual sealed chassis modules and the two-phase condenser tank.

Another example can include any of the above and/or below examples where the vapor coupler and the liquid coupler comprise manually operated valves.

Another example can include any of the above and/or below examples where the vapor coupler and the liquid coupler comprise automatic valves that automatically open when the individual sealed chassis modules physically engage with the two-phase condenser tank and automatically close when the individual sealed chassis modules physically disengage from the two-phase condenser tank, or wherein the vapor coupler and the liquid coupler comprise manual valves.

Another example can include any of the above and/or below examples where the multiple sealed chassis modules removably fluidly coupled to a two-phase condenser tank comprise a first group and further comprising a second group comprising other sealed chassis modules removably fluidly coupled to another two-phase condenser tank in the volume.

Another example can include any of the above and/or below examples where the first group is positioned above the second group in the volume.

Another example includes a system comprising first and second sealed chassis modules that have spaced apart first and second major planar sides that are oriented vertically and include multiple computing devices positioned therebetween, and a first major planar side of the first sealed chassis module is juxtaposed against a second major planar side of the second sealed chassis module and a fluid chiller that is fluidly coupled to both the first and second sealed chassis modules such that either of the first and second sealed chassis modules can be uncoupled while the other of the first and second sealed chassis modules remains fluidly coupled to the fluid chiller.

Another example can include any of the above and/or below examples where the first and second sealed chassis modules comprise two of at least ten sealed chassis modules that are arranged side by side in a bookshelf manner and which are all fluidly coupled to the fluid chiller.

Another example can include any of the above and/or below examples where the spaced apart first and second major planar sides of the first sealed chassis module are defined by a seamless housing.

Another example can include any of the above and/or below examples where the fluid chiller comprises a two-phase condenser tank configured to remove sufficient energy from coolant received from the first and second sealed chassis modules to cause a phase change from gas phase coolant to liquid phase coolant, or wherein the fluid chiller is configured to cool coolant received from the first and second sealed chassis modules and return the cooled coolant to the first and second sealed chassis modules.

Another example can include any of the above and/or below examples where coolant received from the first and second sealed chassis modules comprises liquid phase coolant and the cooled coolant returned to the first and second sealed chassis modules comprises liquid phase coolant.

Another example includes a system comprising a two-phase condenser tank that contains a condenser and defines a set of upper couplers and a set of lower couplers and multiple upright sealed chassis modules that are positioned adjacent to one another and that contain multiple electronic components positioned in a liquid phase of a two-phase coolant, individual upright sealed chassis modules having an upper coupler configured to removably fluidly couple to one of the upper couplers of the two-phase condenser tank and a lower coupler configured to removably fluidly couple to one of the lower couplers of the two-phase condenser tank.

Another example can include any of the above and/or below examples where the multiple electronic components comprise multiple computing devices.

Another example can include any of the above and/or below examples where each coupler of the set of upper couplers and the set of lower couplers include valves.

Another example can include any of the above and/or below examples where the valves of the upper and lower couplers of the individual upright sealed chassis modules and the valves of the couplers of the upper set of couplers and the lower set of couplers of the two-phase condenser tank automatically close when the individual upright sealed chassis modules are decoupled from the two-phase condenser tank.

Another example can include any of the above and/or below examples where the electronic components of other individual upright sealed chassis modules can continue to operate when the individual upright sealed chassis modules are decoupled.

Another example can include any of the above and/or below examples where the system further comprises a pump that moves a mix of gas phase and liquid phase two-phase coolant from the multiple upright sealed chassis modules through the set of upper couplers into the two-phase condenser tank.

Another example can include any of the above and/or below examples where the system further comprises a filter and wherein at least some of the liquid phase two-phase coolant that is moved by the pump is filtered by the filter.

Another example can include any of the above and/or below examples where the two-phase condenser tank comprises a single two-phase condenser tank that is fluidly coupled to all of the multiple upright sealed chassis modules, or wherein the two-phase condenser tank comprises multiple two-phase condenser tanks where individual two-phase condenser tanks are fluidly coupled to a subset of the multiple upright sealed chassis modules, or wherein the two-phase condenser tank comprises multiple two-phase condenser tanks where individual two-phase condenser tanks are fluidly coupled to a single one of the multiple upright sealed chassis modules.

CONCLUSION

Although the subject matter relating to two-phase coolant data center modules and racks has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A system, comprising:
a two-phase condenser tank that contains a condenser and defines a set of upper couplers and a set of lower couplers; and,
multiple upright sealed chassis modules that are each positioned on a common horizontal plane with major surfaces extending vertically upwards from the common horizontal plane and that are positioned adjacent to one another and that contain multiple electronic components positioned in a liquid phase of a two-phase coolant, each of the multiple upright sealed chassis modules comprising upper couplers that are all arranged at equal heights to one another and lower couplers that are all arranged at equal heights to one another and are below and offset from the upper couplers relative to the common horizontal plane, individual upright sealed chassis modules having the upper coupler positioned above the liquid phase of the two-phase coolant and configured to removably fluidly couple to one of the upper couplers of the two-phase condenser tank and the lower coupler configured to removably fluidly couple to one of the lower couplers of the two-phase condenser tank.

2. The system of claim 1, wherein each coupler includes valves and wherein the valves automatically close when the individual upright sealed chassis modules are decoupled from the two-phase condenser tank.

3. The system of claim 2, wherein the electronic components of other individual upright sealed chassis modules can continue to operate when the individual upright sealed chassis modules are decoupled.

4. The system of claim 1, further comprising a pump that moves a mix of gas phase and liquid phase two-phase coolant from the multiple upright sealed chassis modules through the set of upper couplers into the two-phase condenser tank.

5. The system of claim 1, wherein the two-phase condenser tank comprises a single two-phase condenser tank that is removably fluidly coupled to all of the multiple upright sealed chassis modules.

6. A system, comprising:
a two-phase condenser tank that contains a condenser and defines a set of multiple horizontally arranged upper couplers that each directly enter the two-phase condenser tank and a set of multiple horizontally arranged lower couplers that each directly enter the two-phase condenser tank; and, multiple upright sealed chassis modules that are each positioned on a common horizontal plane with major surfaces extending vertically upwards from the common horizontal plane and that are positioned adjacent to one another and that contain multiple electronic components positioned in a liquid phase of a two-phase coolant, each of the multiple upright sealed chassis modules comprising upper couplers that are all arranged at equal heights to one another and lower couplers that are all arranged at equal heights to one another and below the upper couplers, each individual upright sealed chassis module having the upper coupler positioned above the liquid phase of the two-phase coolant and configured to removably fluidly couple to one of the multiple horizontally arranged upper couplers of the two-phase condenser tank that is dedicated to the individual upright sealed chassis module and the lower coupler configured to removably fluidly couple to one of the multiple horizontally arranged lower couplers of the two-phase condenser tank that is dedicated to the individual upright sealed chassis module.

* * * * *